(12) United States Patent
Thompson et al.

(10) Patent No.: US 7,960,247 B2
(45) Date of Patent: Jun. 14, 2011

(54) DIE THINNING PROCESSES AND STRUCTURES

(75) Inventors: Jeffrey C. Thompson, Charlestown, MA (US); Gary B. Tepolt, Pelham, NH (US); Livia M. Racz, Belmont, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 162 days.

(21) Appl. No.: 12/062,864

(22) Filed: Apr. 4, 2008

(65) Prior Publication Data

US 2009/0251879 A1    Oct. 8, 2009

(51) Int. Cl.
*H01L 21/30* (2006.01)

(52) U.S. Cl. ........ 438/459; 438/458; 438/118; 438/460; 438/464; 257/738; 257/777; 257/787; 257/E23.098

(58) Field of Classification Search .................. 438/459, 438/57, 113, 460, 464, 458; 257/777, 738, 257/778, 787, E23.098
See application file for complete search history.

(56) References Cited

U.S. PATENT DOCUMENTS

| | | | |
|---|---|---|---|
| 4,266,334 A | 5/1981 | Edwards et al. | |
| 4,735,679 A | 4/1988 | Lasky | |
| 5,144,747 A | 9/1992 | Eichelberger | |
| 5,250,843 A | 10/1993 | Eichelberger | |
| 5,480,842 A | 1/1996 | Clifton et al. | |
| 6,013,534 A | 1/2000 | Mountain | |
| 6,017,822 A | 1/2000 | Mountain | |
| 6,020,646 A | 2/2000 | Boyle et al. | |
| 6,492,195 B2 | 12/2002 | Nakanishi et al. | |
| 6,506,664 B1 | 1/2003 | Beyne et al. | |
| 6,762,074 B1 | 7/2004 | Draney et al. | |
| 6,861,336 B1 | 3/2005 | Hampton | |
| 6,882,036 B2 | 4/2005 | Draney et al. | |
| 7,122,447 B2 | 10/2006 | Abe et al. | |
| 7,271,033 B2 | 9/2007 | Lin et al. | |
| 7,292,381 B1 | 11/2007 | Patterson et al. | |
| 2003/0045072 A1 | 3/2003 | Jiang | |
| 2003/0060034 A1 | 3/2003 | Beyne et al. | |
| 2003/0070517 A1 | 4/2003 | Tsujimoto | |
| 2004/0009649 A1* | 1/2004 | Kub et al. | 438/459 |
| 2004/0097054 A1 | 5/2004 | Abe | |
| 2004/0203188 A1 | 10/2004 | Draney et al. | |

(Continued)

FOREIGN PATENT DOCUMENTS

EP    1 152 464    11/2001

(Continued)

OTHER PUBLICATIONS

Cobb et al. "Process Considerations for Manufacturing 50 μm Thinned III-V Wafers" [online]. CS Mantech Conference, May 14-17, 2007, Austin, Texas, USA, pp. 21-23. [retrieved Apr. 2, 2008]. Retrieved from the the Internet: <http://www.gassmantech.com/Digests/2007/2007%20Papers/02a.pdf>, 3 pages.

(Continued)

*Primary Examiner* — Matthew S Smith
*Assistant Examiner* — Wilner Jean Baptiste
(74) *Attorney, Agent, or Firm* — Goodwin Procter LLP

(57) ABSTRACT

Microelectronic dies are thinned according to a variety of approaches, which may include bonding the dies to a substrate under vacuum, disposing a film over the dies and the substrate, and/or changing a center of pressure during thinning.

32 Claims, 7 Drawing Sheets

U.S. PATENT DOCUMENTS

| | | |
|---|---|---|
| 2006/0046350 A1 | 3/2006 | Jiang et al. |
| 2006/0270104 A1 | 11/2006 | Trovarelli et al. |
| 2006/0275941 A1* | 12/2006 | Oliver et al. .................. 438/57 |
| 2008/0001268 A1 | 1/2008 | Lu |

FOREIGN PATENT DOCUMENTS

| | | |
|---|---|---|
| EP | 1152464 A2 | 11/2001 |
| WO | WO-99/25019 | 5/1999 |

OTHER PUBLICATIONS

Gurnett et al. "Ultra-Thin Semiconductor Wafer Applications and Processes" [online]. III-Vs Review, vol. 19, Issue 4, May 2006, pp. 38-40, [retrieved Feb. 6, 2008]. Retrieved from the Internet: <http://www.sciencedirect.com/science?_ob=ArticleURL&_udi=B6VM5-4K77FTN-1R&_urlVersion=0&_userid=2502287&md5=1403c25b9264197f5d7c82e0256d59a3>, 6 pages.

"Technology Profile Fact Sheet: Wafer and Die Thinning Technology" [online]. National Security Agency, Central Security Service [retrieved Feb. 6, 2008]. Retrieved via the Internet: >http://www.nsa.gov/techtrans/tech00058.cfm>, 2 pages.

Partial International Search Report for PCT/US2009/039450, mailed Jul. 22, 2009.

International Search Report and Written Opinion for PCT/US2009/039450, mailed Sep. 9, 2009.

* cited by examiner

DIE THINNING PROCESSES AND STRUCTURES

TECHNICAL FIELD

The present invention relates, in various embodiments, to microelectronic dies and to die-thinning methods applicable to a plurality of released dies.

BACKGROUND

In order to achieve appropriate economies of scale, microelectronic integrated circuitry is most often fabricated on large semiconductor wafers that each contain an array of dies. To facilitate handling, these wafers are typically hundreds of micrometers ("μm") thick. Before use, these dies are typically (i) thinned in order to facilitate packaging, and (ii) individuated by cleaving the wafer. Most often, the entire wafer of dies is thinned prior to cleaving in order to efficiently achieve a collection of identical dies with matching thicknesses.

However, for many applications, it may be desirable to thin processed dies following release (i.e., individuation). For example, specialized multichip modules may desirably include a stack of different dies, each of which contains circuitry optimized for a different application or purpose. It may be desirable not to thin such dies prior to individuation from the wafers on which they were processed, because thinned dies are fragile and difficult to handle. Additionally, many dies may be directed toward low-volume application and may not be available and/or cost-effective in full-wafer quantities. Moreover, cracks or damage occurring during the thinning of entire wafers may propagate and affect more than the single die at which they originated, resulting in catastrophic yield loss. Finally, whole-wafer thinning requires significant material removal, as the majority of an entire wafer is removed. Such drastic material removal may be unnecessary if only one or a few of the die thereon need to be thinned. Thus, there exists a need for a process of simultaneously thinning pluralities of released dies to a final desired thickness with a high degree of accuracy and uniformity.

SUMMARY

Limitations of conventional die thinning methods are herein addressed by controllably thinning individual microelectronic dies. Multiple dies may be thinned simultaneously with a high degree of uniformity across each die, and die to die. In various embodiments, thinned dies are handled so as to prevent damage thereto.

In one aspect, embodiments of the invention feature a method of thinning a plurality of microelectronic dies. The method includes providing a film over a plurality of microelectronic dies disposed on a substrate and removing from a top side of each microelectronic die at least a portion of the film disposed thereover. The thickness of each microelectronic die is decreased, and the plurality of microelectronic dies is removed from the substrate. The film may be an adhesive film. In one embodiment, the microelectronic dies are first adhered to the film, and the film is then adhered to the substrate. The underside of each microelectronic die may be adhered to the substrate with an adhesive material, and the thickness of the adhesive film may be approximately equal to the desired final thickness of the plurality of microelectronic dies. Decreasing the thickness of each microelectronic die may include lapping followed by chemical-mechanical polishing. The chemical-mechanical polishing may be performed at a rate which substantially diminishes when the thickness of each microelectronic die is approximately equal to the thickness of the film. The thickness of each microelectronic die may be decreased to less than 40 μm, and the thickness of each microelectronic die may be decreased such that the total thickness variation of the microelectronic dies is less than ±1.5 μm.

In another aspect, embodiments of the invention feature another method of thinning a plurality of microelectronic dies. The method includes disposing the plurality of microelectronic dies on a substrate under vacuum. In addition, the thickness of each microelectronic die is decreased, and the microelectronic dies are removed from the substrate. The thickness of each microelectronic die may be decreased to less than 40 μm, and the total thickness variation of the microelectronic dies is less than ±1.5 μm.

In yet another aspect, embodiments of the invention feature yet another method of thinning a plurality of microelectronic dies. The method includes disposing the plurality of microelectronic dies on a substrate and decreasing the thickness of each by applying pressure to a thinning fixture along a first center of pressure, thereby giving the microelectronic dies an interim total thickness variation. In addition, the thickness of each microelectronic die may be decreased by applying pressure to the thinning fixture along a second (and different) center of pressure, thereby giving the microelectronic dies a final total thickness variation less than the interim total thickness variation. The microelectronic dies may then be removed from the substrate. The final total thickness variation may be less than 9 μm, and the interim total thickness variation may be measured prior to the application of pressure along the second center of pressure.

In still another aspect, embodiments of the invention feature still another method of thinning a plurality of microelectronic dies. The method includes suspending the dies within an alignment frame and applying an adhesive to a back side of each of the dies without causing them to undergo damage from lateral motion. The back sides of the dies are adhered to a substrate, the thickness of each die is decreased, and the dies are removed from the substrate. Suspending the dies within the alignment frame may include adhering a film to the alignment frame and disposing the dies on the film in a radially symmetric pattern. The thickness of each microelectronic die may be decreased to less than 40 μm, and the total thickness variation of the microelectronic dies may be less than ±1.5 μm.

In another aspect, embodiments of the invention feature a structure that includes a plurality of microelectronic dies (each having a thickness less than 40 μm) removably bonded with an adhesive material to a substrate, and an adhesive film disposed on the substrate between the microelectronic dies. The total thickness variation of the plurality of microelectronic dies may less than ±1.5 μm. The substrate may consist essentially of glass, and the thickness of the adhesive film may be approximately equal to the thickness of each microelectronic die.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DESCRIPTION

Figure 1:
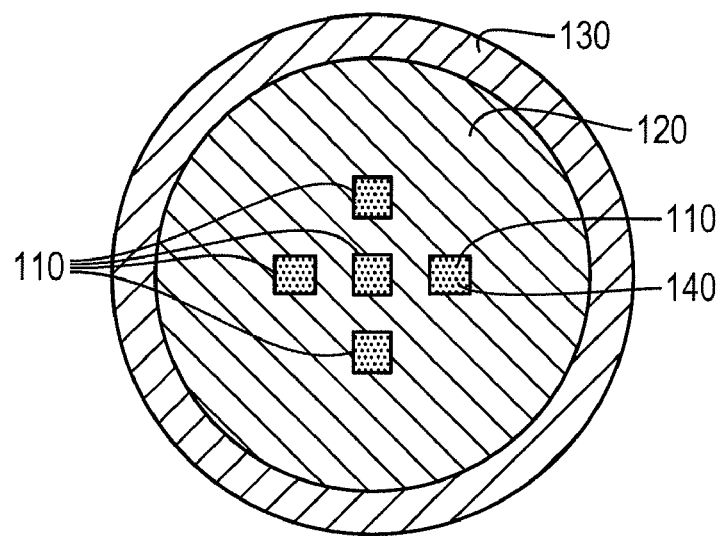
FIG. 1 illustrates a plurality of microelectronic dies disposed on a film in accordance with one embodiment of the invention.

FIG. 1 depicts a plurality of microelectronic dies 110 disposed on a film 120, although, more generally, as few as a single microelectronic die may be disposed on the film 120. Each microelectronic die 110 is to be thinned in accordance with the techniques described herein. A first surface of each microelectronic die 110 is in contact with film 120 and an opposing, second surface typically contains circuitry fabricated thereon. Each microelectronic die 110 may include or consist essentially of at least one semiconductor material such as Si, GaAs, or InP. In various embodiments, each microelectronic die 110 is a microcontroller, a central processing unit, or other type of chip utilized in various electronic components such as sensors or computers. In one embodiment, each microelectronic die 100 is a "module" containing a plurality of microelectronic chips packaged together. For example, a plurality of microelectronic chips may be encapsulated, e.g., in a dielectric material, in a lateral configuration to fabricate a single microelectronic die 100. As illustrated, the microelectronic dies 110 may be disposed on film 120 in a radially symmetric pattern in order to improve uniformity in a die thinning process, as described below.

In order to facilitate accurate placement of a plurality of microelectronic dies 110, film 120 may be placed over an alignment guide (not shown) containing outlines of various sizes and shapes in a radially symmetric pattern. Film 120 may be at least partially transparent, and, as such, the plurality of microelectronic dies 110 may be placed on film 120 in locations defined on the alignment guide thereunder. Film 120 may also be an adhesive film, e.g., Kapton, and may be supported around its perimeter by an alignment ring 130. In an embodiment, alignment ring 130 includes or consists essentially of a rigid material such as a metal, and is utilized in the die mounting process described below with reference to FIGS. 2-4. In order to facilitate subsequent mounting onto a rigid substrate (as described below), a thin layer of adhesive material 140, e.g., wax or shellac, may be applied to the exposed surface (i.e., second surface) of microelectronic die 110. In an embodiment, adhesive material 140 is non-conductive. In addition, adhesive material 140 may be used to form only a temporary bond, i.e., it may be used to form a bond that is reversible upon heating, dissolving, or melting.

Figure 2:
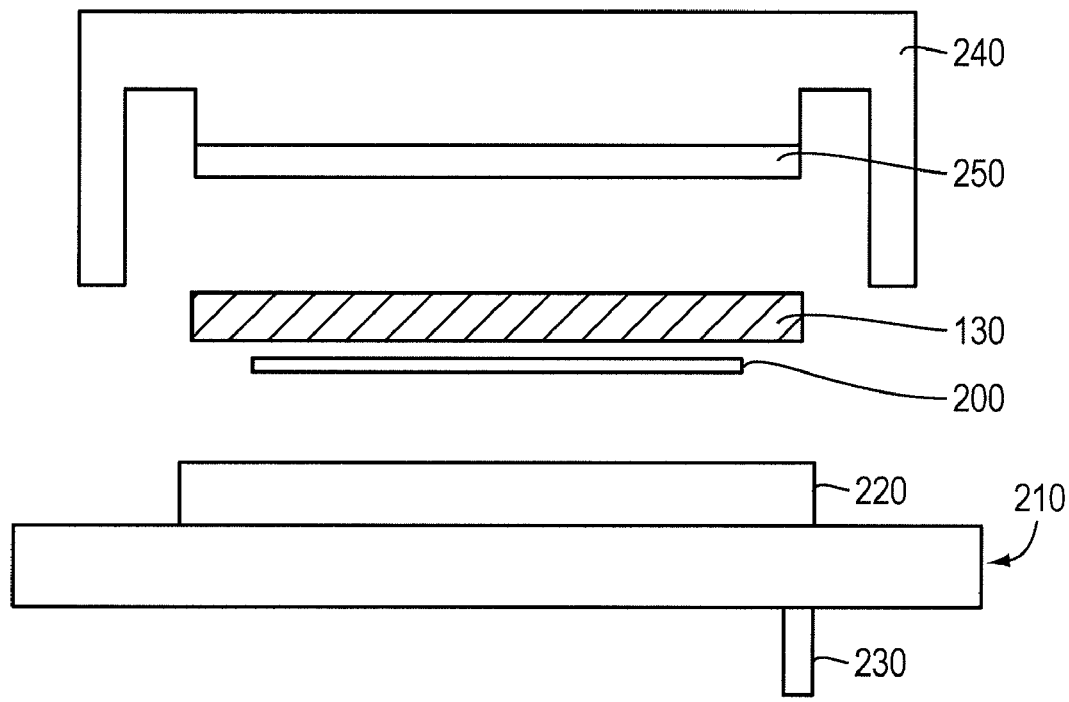
FIG. 2 illustrates a breakaway view of exemplary elements that may be utilized to mount microelectronic dies to a substrate in accordance with one embodiment of the invention.

FIG. 2 illustrates exemplary elements that may be utilized to mount one or more microelectronic dies 110 to a substrate 200, upon which the microelectronic dies 110 may be subsequently thinned to a desired thickness as described below. In one embodiment, a lamination fixture 210 includes a platen 220 and a vacuum port 230, and includes or consists essentially of a rigid material such as a metal. A pressure plate 240 may include or consist essentially of a rigid material such as a metal, and may be sized and shaped to apply pressure to film 120 and substrate 200 and to seal to lamination fixture 210 such that vacuum may be drawn in the space therebetween. In an embodiment, platen 220 is capable of being heated (e.g., resistively) to an elevated temperature (e.g., 160° C.) in order to apply heat to substrate 200, film 120, and/or microelectronic dies 110 during die mounting. Substrate 200 may include or consist essentially of a rigid material, and may be transparent. In an embodiment, substrate 200 includes or consists essentially of glass, e.g., borosilicate glass, and has a thickness of approximately 6.5 mm.

Figure 3:
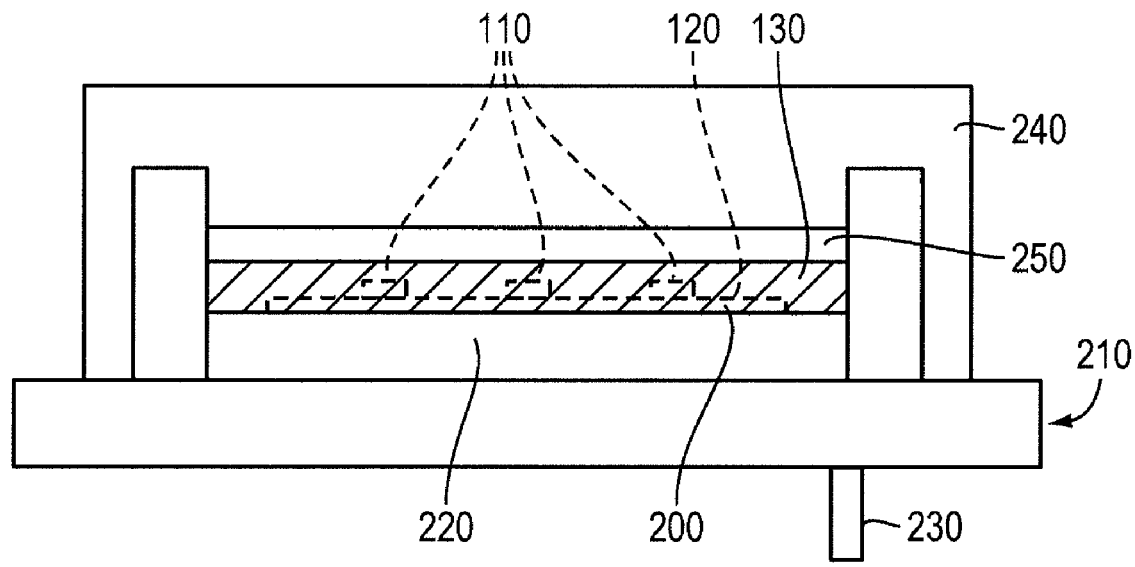
FIG. 3 illustrates an assembled view of the exemplary elements depicted in FIG. 2.
Figure 5:
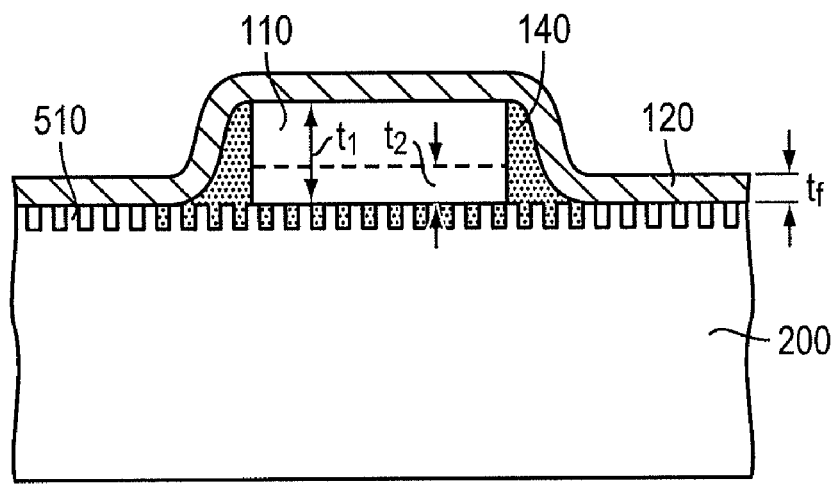
FIG. 5 illustrates a magnified cross-sectional view of a microelectronic die disposed over a substrate in accordance with one embodiment of the invention.

FIG. 3 illustrates in assembled form the exemplary elements depicted in FIG. 2. With reference to both figures, in an embodiment, substrate 200 is placed on platen 220, and alignment ring 130 (with film 120 and microelectronic dies 110) is placed thereover such that the adhesive material 140 of the microelectronic dies 110 directly contacts the substrate 200. Pressure plate 240 may then placed over and in contact with lamination fixture 210, sealing the two together. In an embodiment, pressure plate 240 includes a conformal pad 250 which conforms and applies pressure evenly to film 120 as it conforms to the contours of microelectronic dies 110 during bonding. Thereafter, pressure plate 240 is engaged to contact film 120 such that microelectronic dies 110 (and adhesive material 140 placed thereon) firmly contact substrate 200. Vacuum may be drawn via a vacuum pump attached to vacuum port 230 in order to remove substantially all air around the dies that could be trapped during bonding (as described below), and platen 220 may be heated such that adhesive material 140 softens or at least partially melts. Adhesive material 140 thus bonds microelectronic dies 110 to substrate 200, and pressure plate 240 (e.g., with conformal pad 250) presses portions of film 120 around each microelectronic die 110 (and between each of the plurality of microelectronic dies 110) into contact with substrate 200, thus "sealing" microelectronic dies 110 to substrate 200 (as shown in FIG. 5). The vacuum may additionally remove any trapped air bubbles between microelectronic die 110 and substrate 200 to facilitate a flat, uniform interface therebetween.

Figure 4:
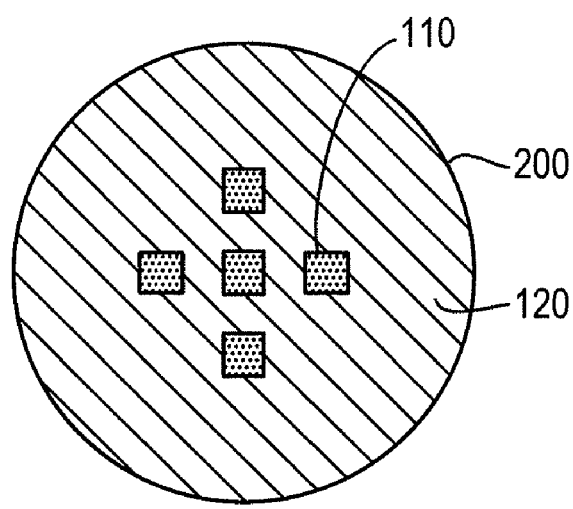
FIG. 4 illustrates a plurality of microelectronic dies mounted on a substrate and covered by a film in accordance with one embodiment of the invention.

As depicted in FIG. 4, substrate 200 (having microelectronic dies 110 mounted thereon and film 120 covering the microelectronic dies 110) may then be removed from pressure plate 240 and lamination fixture 210, and any excess film 120 may be removed from the edges of substrate 200.

FIG. 5 depicts a magnified cross-sectional view of a single microelectronic die 110 and film 120 disposed over substrate 200. As described above, microelectronic die 110 is disposed over and in contact with substrate 200. Film 120 "encapsulates" microelectronic die 110, i.e., a portion of film 120 is disposed over microelectronic die 110, and other portions are in contact with substrate 200. In an embodiment, during the mounting process, the heated adhesive material 140 flows around at least the vertical sides of microelectronic die 110 between it and film 120. This may prevent edge damage (e.g., chipping) of microelectronic die 110, which may occur, e.g., due to lateral motion (i.e., motion along the plane of the surface of substrate 200) of microelectronic die 110 during subsequent thinning processes (described below).

As illustrated in FIG. 5, the top surface of substrate 200 may also contain protrusions 510. Protrusions 510 may be, e.g., pillars and may each have a height of approximately 12 µm and a diameter of approximately 20 µm. The top surfaces of protrusions 510 may be substantially co-planar, thereby effectively forming a flat but incomplete surface to support microelectronic die 110. In another embodiment, substrate 200 has a solid, predominately flat top surface. The presence of protrusions 510 may be preferred, however, because 1) the amount of surface area of substrate 200 contacting microelectronic die 110 is decreased, facilitating release of microelectronic die 110 after thinning, and 2) as shown in FIG. 5, adhesive material 140 may freely flow between protrusions 510 and microelectronic die 110 to ensure microelectronic die 110 is seated on substrate 200 with a high degree of flatness.

With continued reference to FIG. 5, in one embodiment, microelectronic die 110 has an initial thickness $t_1$, which may be greater than 100 µm, e.g., in the range of 150 µm to 330 µm. In the case where more than one microelectronic die 110 is mounted on substrate 200, each die 110 may have approximately the same thickness or at least one microelectronic die 110 may have a thickness greater than the other microelectronic dies 110. After thinning (described below), microelectronic dies 110 will all have a final thickness $t_2$, which may be less than 100 µm, e.g., approximately 40 µm or even less. In an embodiment, final thickness $t_2$ is approximately equal to the thickness $t_f$ of film 120, e.g., within ±10% of, or even equal to, $t_f$.

Figure 6:
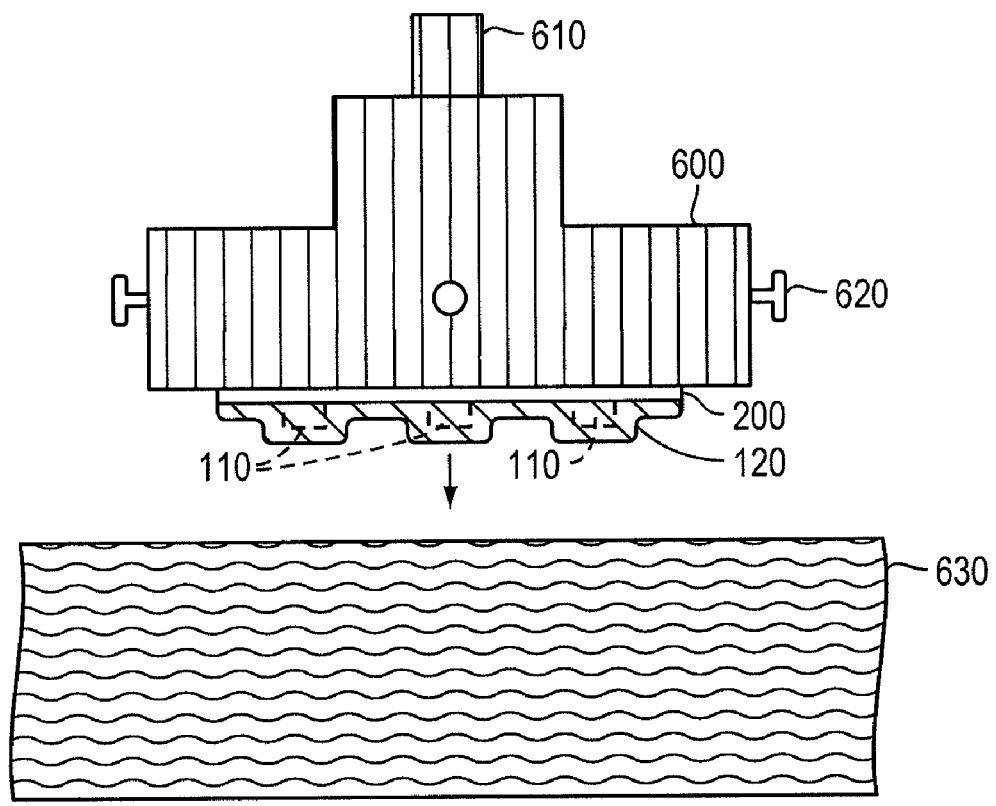
FIG. 6 illustrates a side view of a mechanical lapping apparatus utilized to thin microelectronic dies in accordance with various embodiments of the invention.

Referring to FIG. 6, substrate 200 with microelectronic dies 110 and film 120 mounted thereon may be attached to thinning fixture 600. In an embodiment, substrate 200 is attached to thinning fixture 600 by means of a retaining ring (not shown). Thinning fixture 600 may include a connector 610, which may connect thinning fixture 600 to various apparatuses for thinning and/or measuring the thickness of microelectronic dies 110. Adjustment means 620, which may be, e.g., at least one thumbscrew, may be utilized to alter the center of pressure transmitted through connector 610 and applied to a microelectronic die 110 during thinning processes. Such adjustments may be used, for example, to alter thinning rates as a function of radial distance from the center of thinning fixture 600 (and/or substrate 200), thus altering the thickness uniformity of one or more thinned microelectronic dies 110. Once substrate 200 is attached to thinning fixture 600, thinning fixture 600 may be connected to, e.g., a pressure head (not shown). The pressure head may apply pressure to bring film 120 and/or microelectronic dies 110 into contact with lapping plate 630. Lapping plate 630 may be formed of a rigid material, e.g., a copper composite, which acts as a platform for a polishing slurry, e.g., diamond particles suspended in a liquid such as water. In one embodiment, during the lapping process, lapping plate 630 rotates, and the mechanical action of the polishing slurry against film 120 and/or microelectronic die 110 removes material from surface(s) thereof.

Figure 7:
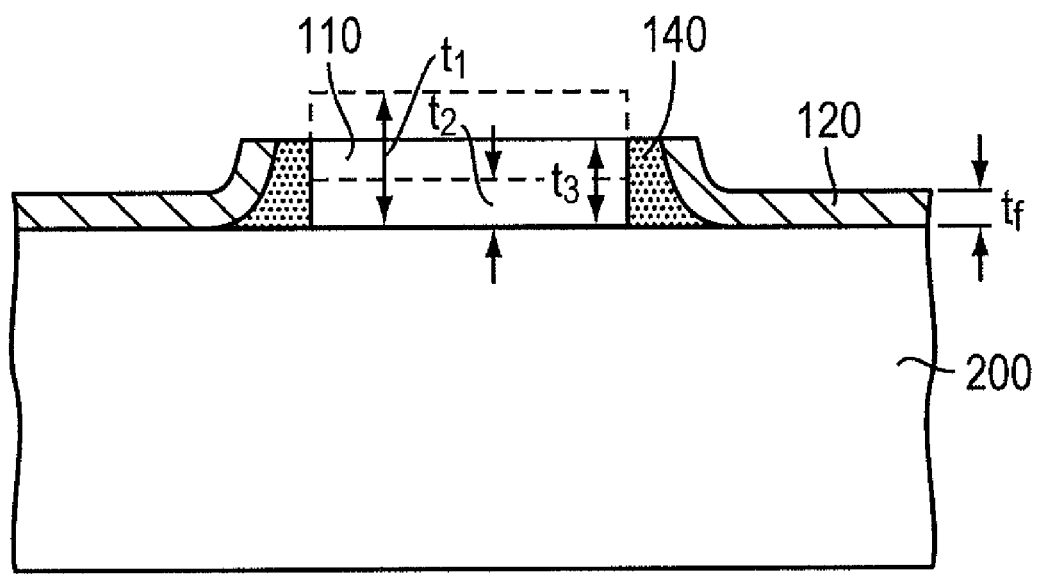
FIG. 7 illustrates a cross-sectional view of an exemplary microelectronic die after a lapping process in accordance with one embodiment of the invention.

FIG. 7 depicts a single microelectronic die 110 mounted upon substrate 200 after the lapping process. For clarity, protrusions 510 on substrate 200 are not shown in FIG. 7 and subsequent figures. In one embodiment, during lapping, the portion of film 120 disposed above microelectronic die 110 is removed, as is a portion of the thickness of microelectronic die 110. As illustrated in FIG. 7, microelectronic die 110 has an intermediate thickness $t_3$ which is less than its initial thickness $t_1$ but greater than a desired final thickness $t_2$. In an embodiment, intermediate thickness $t_3$ is approximately 50 µm. As described above, the presence of adhesive material 140 around the vertical edges of microelectronic die 110 may prevent edge damage, e.g., chipping, thereto.

Referring now to both FIGS. 6 and 7, in order to improve thickness uniformity during the lapping process, the remaining thickness of microelectronic die 110 may be measured even before it reaches the desired intermediate thickness $t_3$. For example, a portion of the thickness of one or more microelectronic dies 110 may be removed by lapping, and the remnant thickness thereof may be measured, e.g., by use of a drop gauge. Such measurements may be used to calculate either an initial intradie (i.e., across a single microelectronic die 110) or interdie (i.e., die-to-die) total thickness variation ("TTV"), or both. Based on the initial TTV, the center of pressure applied through connector 610 may be adjusted via adjustment means 620. For example, adjustment means 620 may be utilized to alter the angle of attack of thinning fixture 600, thus varying (e.g., moving off-center) the region of maximal applied pressure (to microelectronic dies 110) during lapping. The lapping process may then be recommenced. After the lapping process, intermediate thickness $t_3$ of one or more microelectronic die 110 may be measured, providing a post-lapping intradie or interdie TTV, or both. The use of adjustment means 620 to alter the center of pressure during lapping enables a post-lapping TTV less than the initial TTV. In an embodiment, the post-lapping interdie TTV is less than 9 µm. In an embodiment, the post-lapping interdie TTV is less than 5 µm, or even less than 2 µm.

After lapping, thinning fixture 600 may be connected to a polishing drive shaft (not shown) on, e.g., a chemical-mechanical polishing ("CMP") system for further material removal. Similar to the lapping process described above, the CMP process may further thin one or more microelectronic dies 110 via combined chemical attack (from, e.g., the CMP slurry) and mechanical action against a polishing pad (analogous to lapping plate 630 described above, but normally formed of a softer material). The polishing pad may be a polymer-based material, e.g., a polyurethane. In an embodiment, the CMP process incorporates a slurry that includes a 1:19 mixture of Glanzox HP-20 (available from Fujimi Corporation of Tualatin, Oreg.) and deionized water, as well as a IC1000-k groove polishing pad (available from Rohm and Haas Company of Philadelphia, Pa.). The CMP process may be performed on any number of suitable CMP tools, e.g., the APD-500 (available from Araca, Inc. of Tucson, Ariz.) or the RotoPol-31 (available from Struers Inc. of Cleveland, Ohio). With reference again to FIG. 7, in an embodiment, film 120 around and between microelectronic die(s) 110 acts as a polish stop during the CMP process, as the polishing rate of film 120 is preferably much less than the polishing rate of microelectronic die 110. Therefore, as the thickness of microelectronic die 110 approaches that of film 120, the rate of material removal of microelectronic die 110 may slow considerably. Thus, the CMP process preferably thins microelectronic die 110 to a final thickness $t_2$ approximately equal to the film 120 thickness $t_f$.

The use of film 120 with an arbitrary substrate 200 for thinning microelectronic dies 110 enables a flexible process; an identical substrate 200 (or any other one) may be used in conjunction with a film 120 having a different thickness $t_f$ to facilitate the thinning of microelectronic die 110 to a different preferred final thickness. Thus, embodiments of the present invention are superior to thinning methods utilizing custom substrates with polish stops fixed at particular heights.

Figure 8:
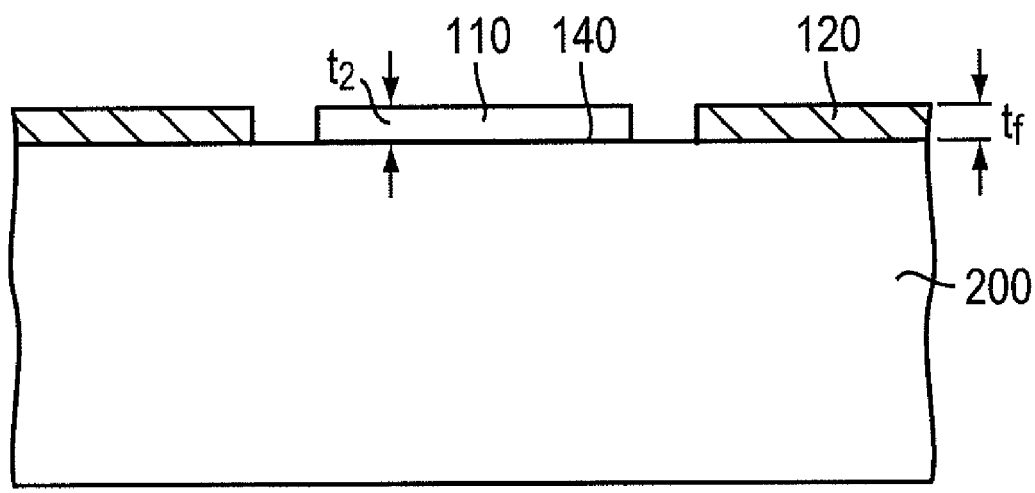
FIG. 8 illustrates a cross-sectional view of an exemplary microelectronic die after a chemical-mechanical polishing process in accordance with one embodiment of the invention.

FIG. 8 illustrates an exemplary microelectronic die 110 after the CMP process. The thickness of microelectronic die is the final desired thickness $t_2$, e.g., 40 μm or even less. Moreover, the caustic nature of the CMP slurry has removed substantially all of adhesive material 140 disposed between microelectronic die 110 and film 120 and around the edges of microelectronic die 110 (other than between the microelectronic die 110 and substrate 200), thereby facilitating the subsequent removal of thinned microelectronic die 110 from substrate 200. After the CMP process, the interdie TTV of microelectronic dies 110 may be less than ±1.5 μm, and the intradie TTV of each microelectronic die 110 may be less than 1 μm.

Figure 9:
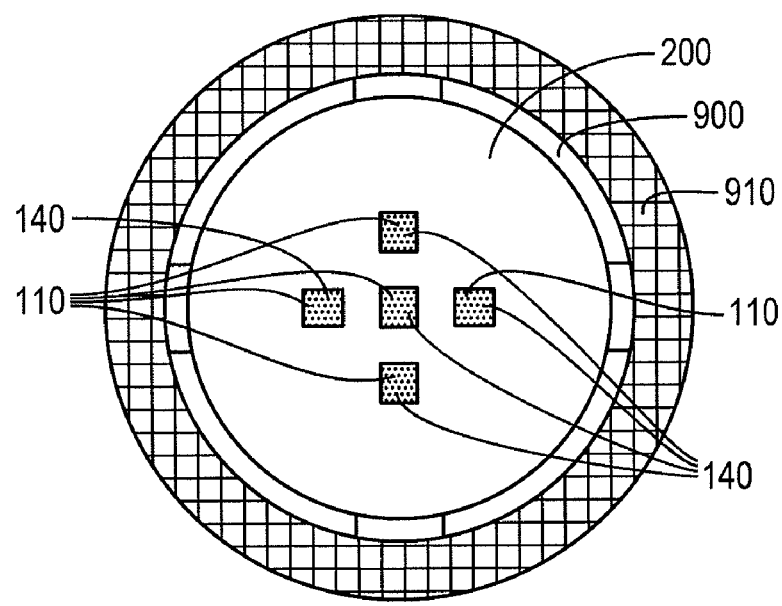
FIGS. 9 and 10 illustrate schematic views of an apparatus utilized for releasing thinned microelectronic dies from a substrate in accordance with various embodiments of the invention.
Figure 10:
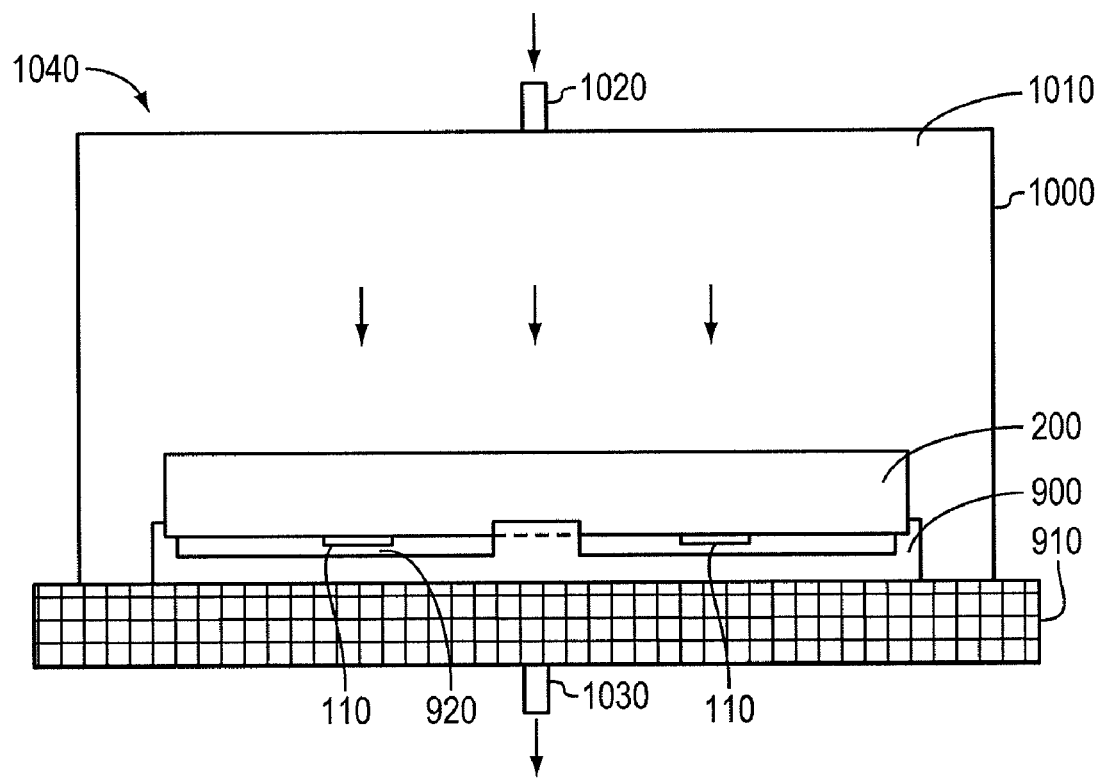

At least one thinned microelectronic die 110 may be removed from substrate 200 for further handling, inspection, and/or processing. FIGS. 9 and 10 depict schematic top and side views, respectively, of an apparatus utilized for releasing thinned microelectronic dies 110 from a substrate 200 in accordance with various embodiments of the invention. As illustrated, substrate 200 may be placed within a release holder 900 with microelectronic die 110 (still adhered to substrate 200 with adhesive material 140) facing downward. Substrate 200 and release holder 900 may be placed above a screen 910. In one embodiment, release holder 900 is sized and shaped to suspend substrate 200 above screen 910 with a small gap 920 (see FIG. 10) therebetween to facilitate the flow of a liquid release agent to remove the remnant adhesive material 140 that holds microelectronic die 110 on substrate 200. Screen 910 may include openings large enough to allow the free flow of the release agent, but small enough to catch and support released microelectronic die 110.

As illustrated in FIG. 10, a flow chamber 1000 may be placed above screen 910 and sealed to prevent the leakage of release agent 1010 once flow chamber 1000 is filled therewith. Release agent 1010 is preferably a liquid capable of dissolving adhesive material 140 without etching or damaging microelectronic die 110, substrate 200, release holder 900, or screen 910. In an embodiment, release agent 1010 is a solvent such as ethanol. A pump (not shown) may be attached to inlet 1020 and outlet 1030 to circulate release agent 1010 in the general direction toward screen 910 (i.e., in the "release direction"). Such circulation may speed the release of microelectronic die 110. The entire release apparatus 1040 (including flow chamber 1000, screen 910, release holder 900, substrate 200, and release agent 1010) may be placed in a heated environment (not shown) in order to enhance the removal of adhesive material 140 (e.g., by softening or melting).

Figure 11:
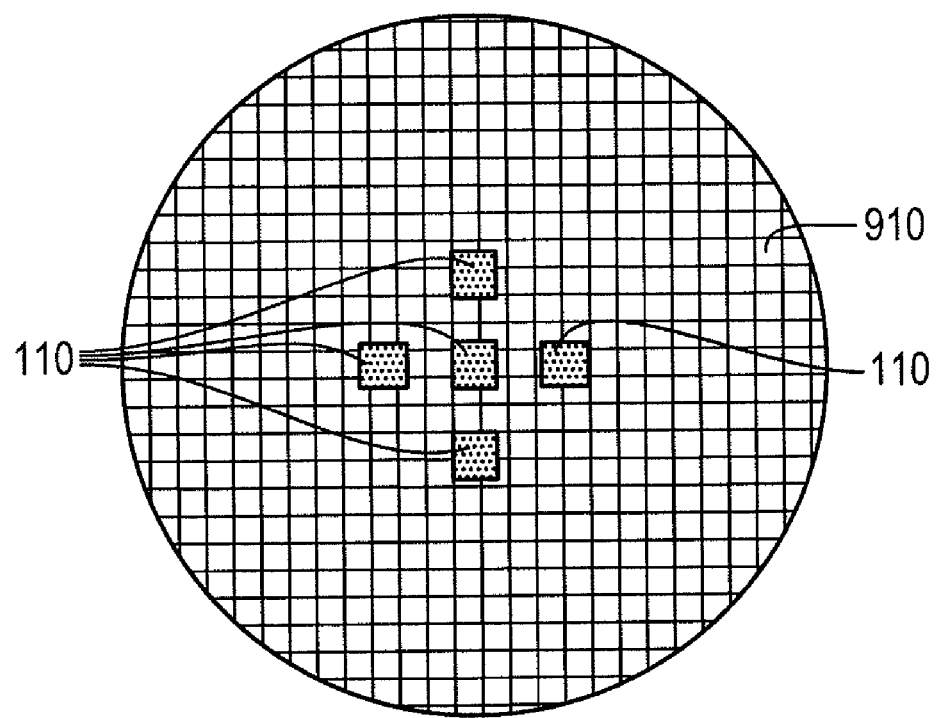
FIG. 11 illustrates thinned microelectronic dies disposed on a screen after release from a substrate in accordance with one embodiment of the invention.

As illustrated in FIG. 11, after release from substrate 200, at least one thinned microelectronic die 110 is disposed on screen 910, ready for further handling. After release from substrate 200, thinned microelectronic dies 110 may be extremely fragile and are thus, in accordance with one embodiment, handled with a great degree of care.

Figure 12A:
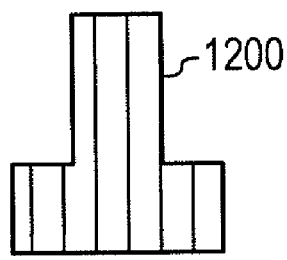
FIGS. 12A and 12B illustrate side and bottom views, respectively, of one embodiment of a handling device for microelectronic dies.
Figure 12B:
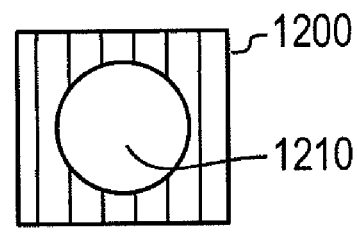

Typical handling means for handling microelectronic die 110, e.g., an end effector, utilize vacuum to pick up the die 110. FIGS. 12A and 12B depict the side view and bottom view, respectively, of a typical end effector 1200 that includes a single vacuum inlet 1210. However, such handling means 1200 typically draw vacuum from a single point, thus concentrating the force upon the die 110 at that point. Such a concentration of force may result in damage, e.g., cracking, of the die 110 originating at that point. Accordingly, end effector 1200 is typically not feasible for use with thinned microelectronic die 110.

Figure 13A:
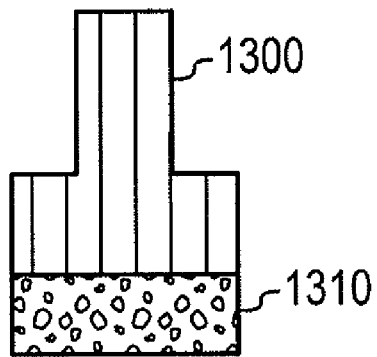
FIGS. 13A and 13B illustrate side and bottom views, respectively, of another embodiment of a handling device for microelectronic dies.
Figure 13B:
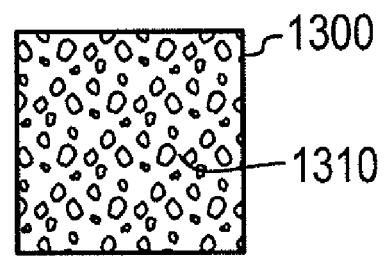

FIGS. 13A and 13B depict the side view and bottom view, respectively, of a handling means 1300 that is optimized for the handling of a thinned microelectronic die 110 having a thickness of less than 100 μm, e.g., 40 μm or less. Handling means 1300 is, e.g., an end effector, and includes diffuser 1310. Diffuser 1310 has a plurality of holes extending therethrough such that vacuum drawn through diffuser 1310 is not concentrated at a single point (as with handling means 1200 depicted in FIGS. 12A and 12B). In an embodiment, diffuser 1310 includes or consists essentially of a porous material, e.g., a metal or a polymer such as polyethylene, or a polymer or other mesh. Diffuser 1310 may be an integrated portion of handling means 1300 or may be removable (in which case handling means 1300 with diffuser 1310 removed will resemble handling means 1200).

Figure 14A:
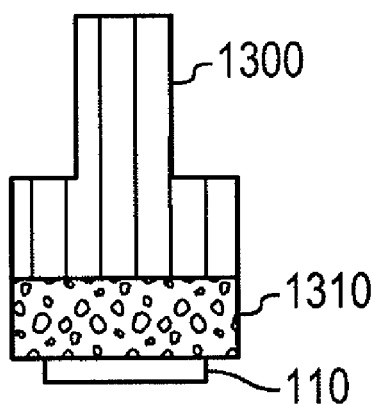
FIGS. 14A and 14B illustrate side and bottom views, respectively, of the handling device depicted in FIGS. 13A and 13B manipulating a thinned microelectronic die in accordance with one embodiment of the invention.
Figure 14B:
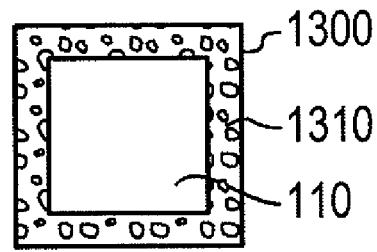

FIGS. 14A and 14B depict side and bottom views, respectively, of the handling means 1300 manipulating a thinned microelectronic die 110 in accordance with one embodiment of the invention. In one embodiment, diffuser 1310 facilitates the handling of thinned microelectronic die 110 without causing damage thereto. Handling means 1300 may also be attached to an automated pick-and-place machine (not shown) for automated handling of thinned microelectronic die 110.

As described, embodiments of the present invention enable the thinning and subsequent handling of microelectronic dies without causing damage thereto. Several released dies may be thinned to a thickness of less than 40 μm with a high degree of uniformity and without permanently mounting them to a handling substrate. Embodiments of the present method enable flexibility in the thinning process, as the final thickness of the microelectronic dies may be selected via selection of the thickness of a tape that may act as a polishing stop. Damage from, e.g., lateral motion, may be minimized or prevented by "encapsulating" the die edges with the adhesive material adhering them to the substrate. Finally, post-thinning handling may advantageously utilize handling means applying a diffuse vacuum rather than vacuum force concentrated at a single point.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method of thinning a plurality of microelectronic dies, the method comprising the steps of:
   providing a film over a plurality of microelectronic dies disposed on a substrate, a thickness of the film being approximately equal to a desired final thickness of the plurality of microelectronic dies;
   removing from a top side of each microelectronic die at least a portion of the film disposed thereover;
   decreasing a thickness of each microelectronic die; and
   removing the plurality of microelectronic dies from the substrate.

2. The method of claim 1, wherein the film is an adhesive film.

3. The method of claim 2, wherein providing the film comprises adhering the plurality of microelectronic dies to the film, and, thereafter, adhering the film to the substrate.

4. The method of claim 1, further comprising adhering an underside of each microelectronic die to the substrate with an adhesive material.

5. The method of claim 4, wherein a) a top surface of the substrate comprises a plurality of protrusions disposed beneath the plurality of microelectronic dies, and b) the adhesive material is disposed between the protrusions.

6. The method of claim 1, wherein decreasing the thickness of each microelectronic die comprises lapping followed by chemical-mechanical polishing.

7. The method of claim 6, wherein chemical-mechanical polishing is performed at a rate which substantially diminishes when the thickness of each microelectronic die is approximately equal to the thickness of the film.

8. The method of claim 1, wherein the thickness of each microelectronic die is decreased to less than 40 µm.

9. The method of claim 1, wherein the thickness of each microelectronic die is decreased such that a total thickness variation of the plurality of microelectronic dies is less than ±1.5 µm.

10. The method of claim 1, wherein the substrate consists essentially of glass.

11. The method of claim 1, wherein thicknesses of at least two of the microelectronic dies are different before the thicknesses are decreased.

12. The method of claim 1, wherein a top surface of the substrate comprises a plurality of protrusions disposed beneath the plurality of microelectronic dies.

13. The method of claim 1, wherein, after the thickness of each microelectronic die has been decreased, a portion of the film remains disposed over the substrate between the microelectronic dies, a thickness of the portion of the film being approximately equal to the thickness of the microelectronic dies.

14. The method of claim 1, wherein decreasing the thickness of each microelectronic die comprises removing a portion of each microelectronic die from the top side thereof after removing the at least a portion of the film disposed thereover.

15. A method of thinning a plurality of microelectronic dies, the method comprising the steps of:
   disposing the plurality of microelectronic dies on a substrate under vacuum;
   disposing a film over the plurality of microelectronic dies and the substrate such that the film is in direct contact with a top surface of the substrate between the microelectronic dies;
   removing only the portions of the film disposed over the microelectronic dies;
   thereafter, decreasing a thickness of each microelectronic die; and
   removing the plurality of microelectronic dies from the substrate.

16. The method of claim 15, wherein the thickness of each microelectronic die is decreased to less than 40 µm.

17. The method of claim 15, wherein the thickness of each microelectronic die is decreased such that a total thickness variation of the plurality of microelectronic dies is less than ±1.5 µm.

18. The method of claim 15, wherein the substrate consists essentially of glass.

19. The method of claim 15, wherein disposing the plurality of microelectronic dies on the substrate comprises forming air bubbles disposed between the microelectronic dies and the substrate, and the vacuum removes the air bubbles.

20. The method of claim 15, wherein disposing the plurality of microelectronic dies on the substrate under vacuum comprises:
   disposing the substrate on a platen;
   disposing the plurality of microelectronic dies over the substrate;
   disposing a pressure plate over the plurality of microelectronic dies;
   exerting pressure on the microelectronic dies to dispose them on the substrate; and
   drawing a vacuum between the platen and the pressure plate.

21. A method of thinning a plurality of microelectronic dies, the method comprising the steps of:
   disposing the plurality of microelectronic dies on a substrate;
   decreasing a thickness of each microelectronic die by applying pressure to a thinning fixture along a first center of pressure, thereby giving the plurality of microelectronic dies an interim total thickness variation;
   decreasing the thickness of each microelectronic die by applying pressure to the thinning fixture along a second center of pressure different from the first center of pressure, thereby giving the plurality of microelectronic dies a final total thickness variation less than the interim total thickness variation; and
   removing the plurality of microelectronic dies from the substrate.

22. The method of claim 21, wherein the final total thickness variation is less than 9 µm.

23. The method of claim 21, further comprising measuring the interim total thickness variation prior to applying pressure to the thinning fixture along the second center of pressure.

24. The method of claim 21, wherein the substrate consists essentially of glass.

25. A method of thinning a plurality of microelectronic dies, the method comprising the steps of:
   suspending a plurality of microelectronic dies within an alignment frame by, at least in part, adhering a film to the alignment frame, and disposing the plurality of microelectronic dies on the film in a radially symmetric pattern;
   applying an adhesive to a back side of each of the dies without causing the dies to undergo damage from lateral motion;
   adhering the back sides of the dies to a substrate;
   decreasing a thickness of each microelectronic die; and
   removing the plurality of microelectronic dies from the substrate.

26. The method of claim 25, wherein the thickness of each microelectronic die is decreased to less than 40 µm.

27. The method of claim 25, wherein the thickness of each microelectronic die is decreased such that a total thickness variation of the plurality of microelectronic dies is less than ±1.5 μm.

28. The method of claim 25, wherein the substrate consists essentially of glass.

29. A structure comprising:
   a plurality of microelectronic dies removably bonded with an adhesive material to a substrate, each microelectronic die having a thickness less than 40 μm; and
   an adhesive film disposed on the substrate between the microelectronic dies,
   wherein a thickness of the adhesive film is approximately equal to the thickness of each microelectronic die and a total thickness variation of the plurality of microelectronic dies is less than ±1.5 μm.

30. The structure of claim 29, wherein the substrate consists essentially of glass.

31. The structure of claim 29, wherein the substrate consists essentially of glass.

32. The structure of claim 29, wherein the adhesive material and the adhesive film are different.

* * * * *